United States Patent
Li et al.

(10) Patent No.: US 12,074,133 B1
(45) Date of Patent: Aug. 27, 2024

(54) CHIP BONDING APPARATUS AND SECURING ASSEMBLY THEREFOR

(71) Applicant: GUANGZHOU AIFO LIGHT COMMUNICATION TECHNOLOGY COMPANY LTD., Guangzhou (CN)

(72) Inventors: Guoqiang Li, Guangzhou (CN); Xinyan Yi, Guangzhou (CN)

(73) Assignee: GUANGZHOU AIFO LIGHT COMMUNICATION TECHNOLOGY COMPANY LTD., Guangzhou (CN)

( * ) Notice: Subject to any disclaimer, the term of this patent is extended or adjusted under 35 U.S.C. 154(b) by 0 days.

(21) Appl. No.: 18/597,172

(22) Filed: Mar. 6, 2024

(30) Foreign Application Priority Data

Sep. 8, 2023 (CN) .......................... 202311158851.4

(51) Int. Cl.
*H01L 23/00* (2006.01)
*H01L 23/32* (2006.01)

(52) U.S. Cl.
CPC .............. *H01L 24/74* (2013.01); *H01L 23/32* (2013.01); *H01L 2224/74* (2013.01); *H01L 2224/7565* (2013.01); *H01L 2224/7665* (2013.01); *H01L 2224/7765* (2013.01); *H01L 2224/7865* (2013.01); *H01L 2224/7965* (2013.01); *H01L 2224/951* (2013.01); *H01L 2224/9511* (2013.01); *H01L 2924/40* (2013.01)

(58) Field of Classification Search
CPC . H01L 24/74; H01L 23/32; H01L 2224/7565; H01L 2224/7665; H01L 2224/7765; H01L 2224/7865; H01L 2224/7965; H01L 2224/951; H01L 2224/9511
See application file for complete search history.

(56) References Cited

FOREIGN PATENT DOCUMENTS

| CN | 105413769 A | 3/2016 |
|----|-------------|--------|
| CN | 215029011 U | 12/2021 |
| CN | 114421277 A | 4/2022 |
| CN | 116344401 A | 6/2023 |
| CN | 219302756 U | 7/2023 |
| JP | 2003017533 A | 1/2003 |
| JP | 2014127532 A | 7/2014 |
| JP | 2017076732 A | 4/2017 |

*Primary Examiner* — David A Zarneke
(74) *Attorney, Agent, or Firm* — Daniel M. Cohn; Howard M. Cohn

(57) ABSTRACT

A chip bonding apparatus and a securing assembly therefor are disclosed. The securing assembly includes a securing bracket, a sliding bracket, and a slide. A first open slot is arranged in the securing bracket, wherein the sliding bracket is slidably mounted on the first open slot, a snap-fitting portion is arranged on a side portion of the sliding bracket, and at least one catch slot that is engageable with the snap-fitting portion to secure the sliding bracket is arranged in the securing bracket. A second open slot is arranged in the sliding bracket, wherein a slideway is arranged in each of two side walls of the second open slot, and the slide is inserted into the slideway and hence mounted in the second open slot.

12 Claims, 5 Drawing Sheets

CHIP BONDING APPARATUS AND SECURING ASSEMBLY THEREFOR

CROSS-REFERENCE TO RELATED APPLICATIONS

This application is based upon and claims priority to Chinese Patent Application No. 202311158851.4, filed on Sep. 8, 2023 and entitled "CHIP BONDING APPARATUS AND SECURING ASSEMBLY THEREFOR," the disclosure of which is incorporated herein by reference in its entirety.

TECHNICAL FIELD

The present disclosure relates to the technical field of chip manufacturing, and in particular, relates to a chip bonding apparatus and a securing assembly therefor.

BACKGROUND

For some chips imposing a stricter requirement on bonding accuracy, a bonding process needs to be performed by a bonding apparatus equipped with a microscopic imaging system, which corrects a deviation between an upper to-be-bonded device and a lower substrate under support of microscopic imaging and then performs bonding. In order to ensure that the microscopic imaging successfully acquires a deviation image between the upper to-be-bonded device and the lower substrate, the upper to-be-bonded device is generally carried by virtue of a slide.

A slide of the conventional bonding apparatus equipped with the microscopic imaging system needs to be secured by virtue of a clip structure. In an actual securing process, mounting and disassembly of the slide using the clip is cumbersome, and a position deviation of the slide is easily caused in the clipping process due to a careless operation, thereby affecting accuracy of the bonding process.

With respect to the above mentioned technical problem, no effective solution has been yet proposed at present.

SUMMARY

Embodiments of the present disclosure are intended to provide a chip bonding apparatus and a securing assembly therefor, to simplify mounting of a slide and improve mounting precision.

In a first aspect, the embodiments of the present disclosure provide a securing assembly for a chip bonding apparatus, applicable to securing a to-be-bonded chip. The securing assembly includes: a securing bracket, a sliding bracket, and a slide; wherein
 a first open slot is arranged in the securing bracket, wherein the sliding bracket is slidably mounted on the first open slot, a snap-fitting portion is arranged on a side portion of the sliding bracket, and at least one catch slot that is engageable with the snap-fitting portion to secure the sliding bracket is arranged in the securing bracket;
 a second open slot is arranged in the sliding bracket, wherein a slideway is arranged in each of two side walls of the second open slot, and the slide is inserted into the slideway and hence mounted in the second open slot;
The securing assembly for the chip bonding apparatus according to the present disclosure implements mounting of a to-be-bonded device by inserting the slide into the first slideway, and achieves position locking when the sliding bracket moves to a position where the snap-fitting portion is engaged with the catch slot. In this way, the mounting position of the slide is accurately adjusted, the bonding precision is effectively improved, the mounting and dismounting operations of the slide are facilitated, and the bonding efficiency is effectively improved.

In an embodiment, the securing assembly further includes an elastic member, wherein the elastic member is arranged between the securing bracket and the sliding bracket, and disposed on a back side of the second open slot.

In this embodiment, where the snap-fitting portion is disengaged from the catch slot, the sliding bracket slides along a direction away from a bottom of the first open slot under an effect of a return elastic action of the elastic member. In this way, the slide is moved to a position where the slide is to be disassembled and replaced, and hence disassembly and replacement of the slide is facilitated for operators.

In an embodiment, a third slideway is arranged in a side wall of the first open slot, wherein the catch slot is in communication with the third slideway, and the snap-fitting portion is arranged in the catch slot or the third slideway.

In an embodiment, the snap-fitting portion is a ball spring secured on the sliding bracket, wherein a ball end of the ball spring is engageable with the catch slot to secure the sliding bracket.

In this embodiment, sliding and securing of the sliding bracket are both performed under the same plane. This solves the problems that position deviation, loosening, fall-off of the to-be-bonded device on the slide.

In an embodiment, the securing bracket is provided with a release button configured to press the ball end of the ball spring to detach from the catch slot.

In an embodiment, a second slideway is arranged in an inner side wall of the first open slot, and a sliding portion slidably connected to the second slideway is arranged on an outer side wall of the sliding bracket; and In an embodiment, the second slideway is obliquely arranged downwards along a direction away from an opening of the first open slot, and a supporting portion extending towards the first open slot is arranged on a bottom of the securing bracket, wherein a first gasket configured to press the slide tight is arranged on a top surface of the supporting portion.

In an embodiment, a second gasket is arranged on a top surface of the first slideway.

In an embodiment, the securing assembly further includes: a corner brace, wherein the corner brace is hinged-mounted at one end to a tail end of the first open slot, and the corner brace is connected to the sliding bracket via a linkage.

In an embodiment, the corner brace is in an L shape, and a third gasket is arranged on an outer swinging end of the corner brace.

In a second aspect, the embodiments of the present disclosure further provide a chip bonding apparatus. The chip bonding apparatus includes the securing assembly according to the first aspect.

The chip bonding apparatus according to the present disclosure achieves mounting and securing of a to-be-bonded device by using the securing assembly, implements mounting of a to-be-bonded device by inserting the slide into the first slideway, and achieves position locking when the sliding bracket moves to a position where the snap-fitting portion is engaged with the catch slot. In this way, the mounting position of the slide is accurately adjusted.

Accordingly, the embodiments of the present disclosure provide a chip bonding apparatus and a securing assembly therefor. The securing assembly implements mounting of a to-be-bonded device by inserting the slide into the first slideway, and achieves position locking when the sliding bracket moves to a position where the snap-fitting portion is engaged with the catch slot. In this way, the mounting position of the slide is accurately adjusted, the bonding precision is effectively improved, the mounting and dismounting operations of the slide are facilitated, and the bonding efficiency is effectively improved.

Figure 1:
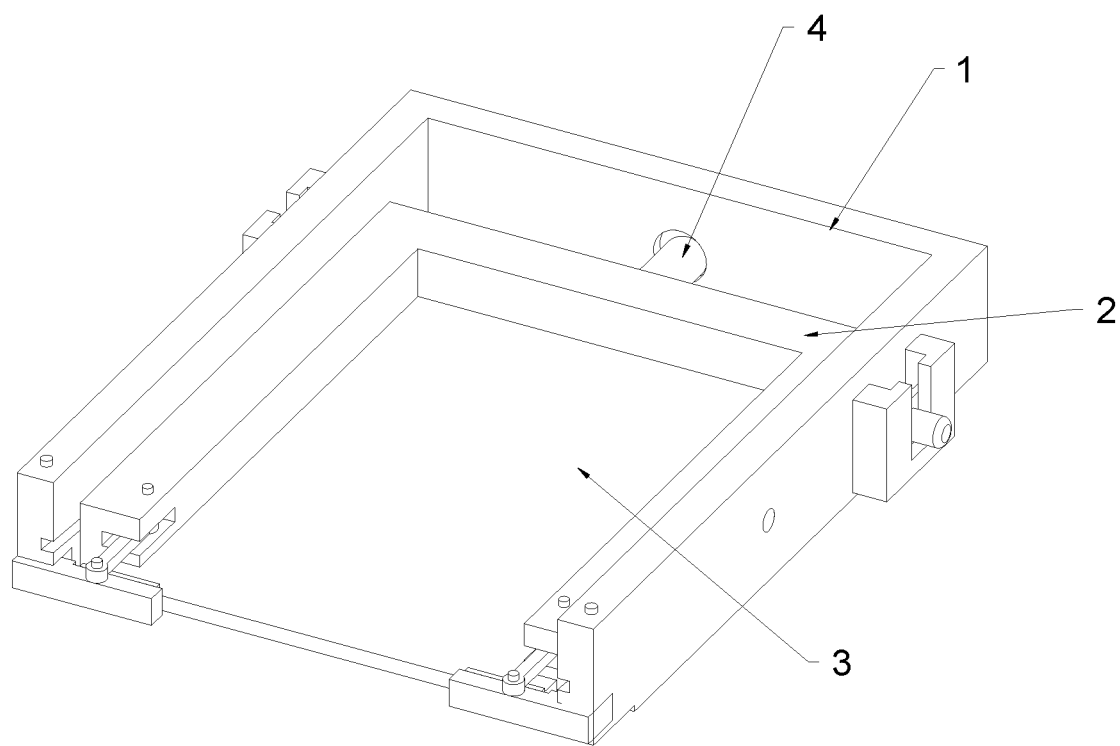
FIG. 1 is a schematic structural diagram of a securing assembly for a chip bonding apparatus according to some embodiments of the present disclosure.
Figure 2:
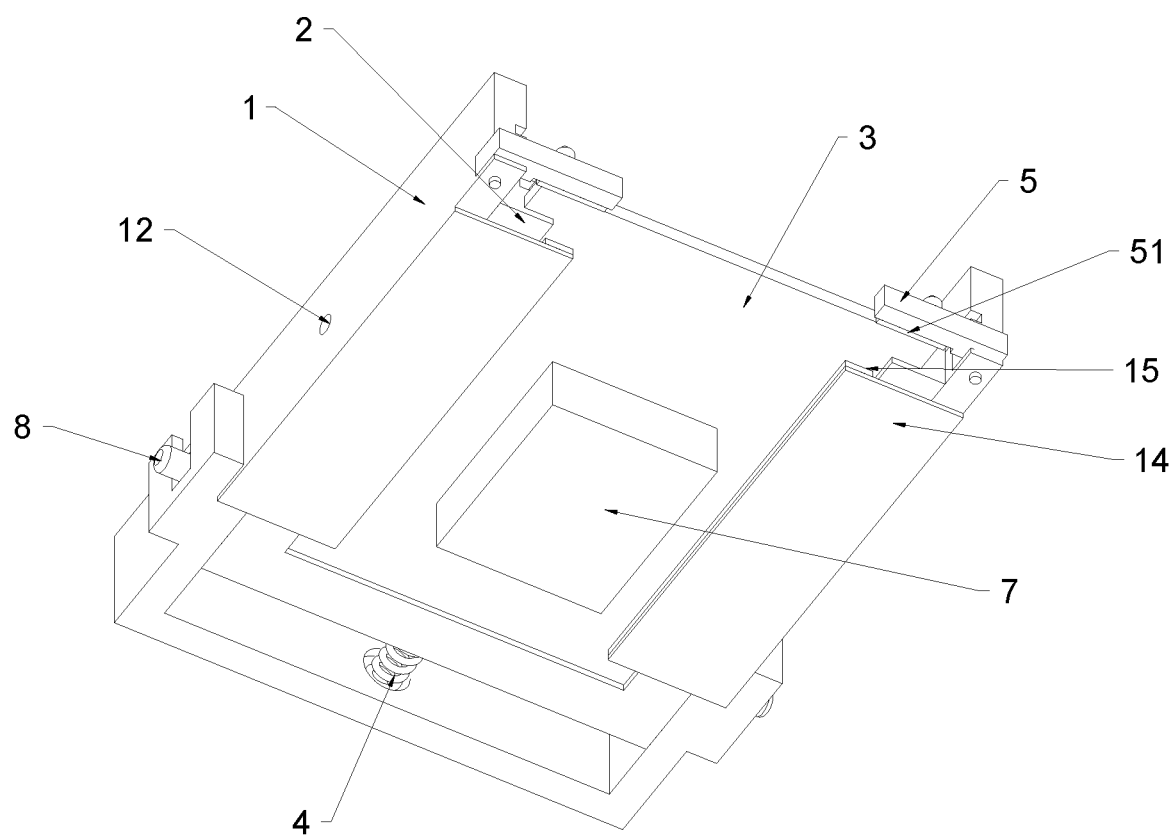
FIG. 2 is a schematic structural diagram of a securing assembly for a chip bonding apparatus, taken from another angle, according to some embodiments of the present disclosure.

Reference numerals and denotations thereof: 1-securing bracket; 2-sliding bracket; 3-slide; 4-elastic member; 5-corner brace; 6-linkage; 7-to-be-bonded device; 8-release button; 11-first open slot; 12-catch slot; 13-second slideway; 14-supporting portion; 15-first gasket; 16-third slideway; 21-snap-fitting portion; 22-second open slot; 23-first slideway; 24-sliding portion; 25-second gasket; 51-third gasket; 100-securing assembly for chip bonding apparatus; 200-base frame; 300-microscopic imaging system; 400-height adjustment mechanism; 500-workbench; 600-horizontal drive adjustment mechanism; and 700-lifting stand.

DETAILED DESCRIPTION

The embodiments of the present disclosure are described in detail hereinafter. Examples of the described embodiments are given in the accompanying drawings, wherein the identical or similar reference numerals constantly denote the identical or similar elements or elements having the identical or similar functions. The specific embodiments described with reference to the attached drawings are all exemplary, and are intended to illustrate and interpret the present disclosure, which shall not be construed as causing limitations to the present disclosure.

In the description of some embodiments of the present disclosure, it should be understood that the terms "central," "transversal," "longitudinal," "length," "width," "thickness," "upper," "lower," "front,", "rear," "left," "right," "vertical," "horizontal," "top," "bottom," "inner," "outer," "clockwise," "counterclockwise," "axial," "radial," "circumferential," and the like indicate orientations and positional relationships which are based on the illustrations in the accompanying drawings, and these terms are merely for ease and brevity of the present disclosure, instead of indicating or implying that the devices or elements shall have a particular orientation and shall be structured and operated based on the particular orientation. Accordingly, these terms shall not be construed as limiting the present disclosure. In addition, terms of "first" and "second" are only used for description, but shall not be understood as indication or implication of relative importance or implicit indication of the number of the specific technical features. Therefore, the features defined by the terms "first" and "second" may explicitly or implicitly include one or more of these features. In the description of the present disclosure, the term "multiple" or "a plurality of" signifies at least two, unless otherwise specified.

In the description of the present disclosure, it should be noted that unless otherwise specified and defined, the terms "mounted," "coupled," and "connected" and derivative forms of these words shall be understood in a broad sense, which, for example, may be understood as fixed connection, detachable connection or integral connection; may be mechanical connection or electrical connection or communicative connection; may be directly connected, indirectly connected via an intermediate medium, communication between the interiors of two elements or interactions between two elements. Persons of ordinary skill in the art may understand the specific meanings of the above terms in the present disclosure according to the actual circumstances and contexts.

In the present disclosure, unless otherwise specified or defined, by defining that a first feature is arranged "above," or "below," or "beneath" a second feature, it means that the first feature is in direct contact with the second feature, or the first feature is in indirect contact with the second feature via another feature or an intermediate medium therebetween. In addition, by defining that a first feature is arranged "over" or "above" a second feature, it means that the first feature is rightly over the second feature or is obliquely above the second feature, or the horizontal height of the first feature is greater than that of the second feature. In addition, by defining that a first feature is arranged "under," or "blow," or "beneath" a second feature, it means that the first feature is rightly under the second feature or is obliquely below the second feature, or the horizontal height of the first feature is less than that of the second feature.

Disclosure hereinafter provides many different embodiments or examples to practice different structures of the present disclosure. For simplification of the disclosure of the present application, parts and settings in specific examples are described hereinafter. Nevertheless, these examples are only intended to illustrate the present disclosure, instead of limiting the present disclosure. In addition, the reference numerals and/or reference letters may be repeated in different examples in the present disclosure. Such repetitions are intended to achieve simplification and clarity, and do not denote a relationship between the discussed embodiments and/or settings. Further, the present disclosure provides examples of various specific processes and materials. However, persons of ordinary skill in the art would note that other processes and/or other materials are also applicable.

In a first aspect, referring to FIG. 1 to FIG. 5, some embodiments of the present disclosure provide a securing assembly for a chip bonding apparatus, applicable to securing a to-be-bonded chip. The securing assembly includes: a securing bracket 1, a sliding bracket 2, and a slide 3.

A first open slot 11 is arranged in the securing bracket 1, wherein the sliding bracket 2 is slidably mounted on the first open slot 11, a snap-fitting portion 21 is arranged on a side portion of the sliding bracket 2, and at least one catch slot 12 that is engageable with the snap-fitting portion 21 to secure the sliding bracket 2 is arranged in the securing bracket 1.

Figure 6:
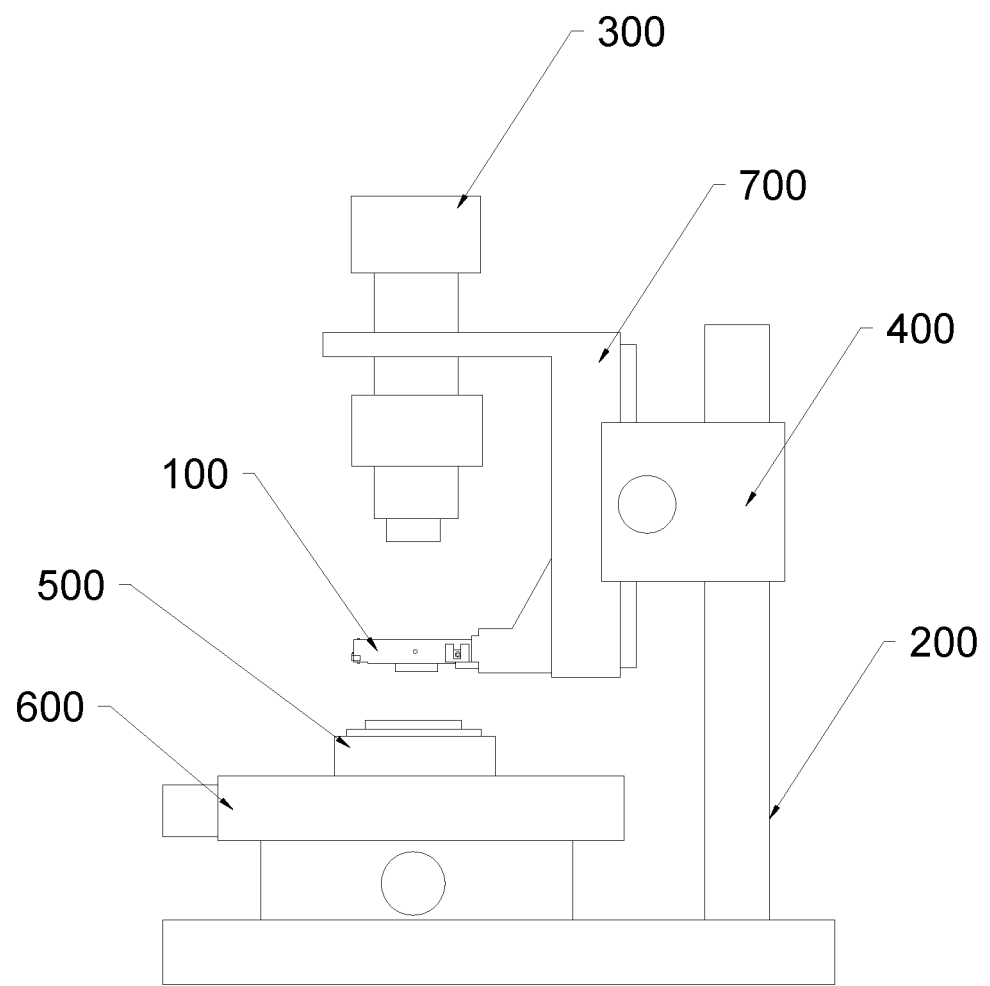
FIG. 6 is a schematic structural diagram of a chip bonding apparatus according to some embodiments of the present disclosure.

A second open slot 22 is arranged in the sliding bracket 2, wherein a slideway 23 is arranged in each of two side walls of the second open slot 22, and the slide 3 is inserted into the slideway 23 and hence mounted in the second open slot 22;

Specifically, the securing assembly according to the embodiments of the present disclosure is applicable to chip bonding apparatuses, especially applicable to the chip bonding apparatus as illustrated in FIG. 6. The securing assembly is configured to lock the position of a to-be-bonded chip and devices related to the to-be-bonded chip, and accurately moves the to-be-bonded chip or the devices related to the to-be-bonded chip to over a to-be-bonded object (for example, a carrier board) for bonding under a driving effect of a related driving assembly of the chip bonding apparatus, which is applicable to bonding chips to be aligned and bonded, for example, semiconductor chips including a plurality of objects to be bonded and packaged, microfluidic chips including an upper-layer chip and a lower-layer substrate, or the like.

More specifically, in order to improve the accuracy of the bonding position, the chip bonding apparatus to which the securing assembly according to the embodiments of the present disclosure is applicable is equipped with a microscopic imaging system 300 for more accurately analyzing and adjusting the position of a to-be-bonded device 7 on the securing assembly. Therefore, the securing assembly needs to employ a transparent and observable slide 3 as a carrier for the to-be-bonded device 7. The to-be-bonded device 7 is arranged at a bottom of the slide 3, and may be secured to the bottom of the slide 3 by a viscous liquid or an adhesive having an adhesion strength lower than that of the bonding layer. Where the to-be-bonded device 7 is made of a high molecular polymer, the to-be-bonded device 7 may be naturally adhered to the bottom of the slide 3 depending on a molecular polymerization force of the upper-layer chip as a high molecular polymer, such as the upper-layer chip of a microfluidic chip made of a high molecular polymer.

The working principle of the present disclosure is as follows: Prior to the bonding process, the slide 3 carrying the to-be-bonded device 7 thereon is inserted into the second open slot 22 along the first slideway 23, and then a pushing force is applied to the slide 3, which changes the position of the sliding bracket 2 on the securing bracket 1; where the slide 3 moves to a securing position, the sliding bracket 2 is secured onto the securing bracket 1 by engagement between the snap-fitting portion 21 and the catch slot 12, such that the position of the slide 3 is secured, and thereafter, the to-be-bonded device 7 may be stably and accurately bonded to a target object using the chip bonding device; upon completion of the bonding, an operator is capable of unlocking a securing relationship between the securing bracket 1 and the sliding bracket 2 by releasing the engagement between the snap-fitting portion 21 and the catch slot 12, conveniently taking out the slide 3 from the second open slot 22 when the sliding bracket 2 is pushed out outwards, and completing slide changing.

More specifically, a plurality of catch slots 12 are exemplarily arranged. The catch slots 12 at different positions are engageable with the snap-fitting portion 21 to secure the sliding bracket 2 to different positions on the securing bracket 1, such that the slide 3 can be positioned at different positions.

It should be noted that the first slideway 23 is horizontally arranged, the slide 3 is inserted into the second open slot 22 in a horizontal state, the process of adjusting the position of the securing assembly by the chip bonding apparatus is a fine adjustment process with high precision, and the slide 3 can be stably held in the sliding bracket 2 in both sliding and secured states of the sliding bracket 2 under support of a friction force generated by the contact with the first slideway 23.

The securing assembly for the chip bonding apparatus according to the embodiments of the present disclosure implements mounting of a to-be-bonded device 7 by inserting the slide 3 into the first slideway 23, and achieves position locking when the sliding bracket 2 moves to a position where the snap-fitting portion 21 is engaged with the catch slot 12. In this way, the mounting position of the slide 3 is accurately adjusted, the bonding precision is effectively improved, the mounting and dismounting operations of the slide 3 are facilitated, and the bonding efficiency is effectively improved.

More specifically, the catch slot 12 is arranged in each of two side walls of the first open slot 11, the catch slots 12 in the two side walls are symmetrically arranged, and the snap-fitting portion 21 is arranged on each of both sides of the sliding bracket 2. This embodiment enables both sides of the sliding bracket 2 to be symmetrically secured onto the securing bracket 1 where the snap-fitting portions 21 are engaged with the catch slots 12, thereby ensuring that the position thereof is secured accurately and stably.

In some exemplary embodiments, the securing assembly further includes an elastic member 4. The elastic member 4 is arranged between the securing bracket 1 and the sliding bracket 2, and disposed on a back side of the second open slot 22.

Specifically, in the process of pushing the sliding bracket 2 towards the inside of the securing bracket 1 for securing, the elastic piece 4 is compressed; upon completion of the bonding process, where the snap-fitting portion 21 is disengaged from the catch slot 12, the sliding bracket 2 slides along a direction away from a bottom of the first open slot 11 under an effect of a return elastic action of the elastic member 4. In this way, the slide 3 is moved to a position where the slide 3 is to be disassembled and replaced, and hence disassembly and replacement of the slide 3 is facilitated for operators.

More specifically, the elastic member 4 simplifies the process of mounting and aligning the slide 3: In the process of inserting the slide 3 into the first slideway 23, the sliding bracket 2 is kept stationary by an elastic action of the elastic member 4, and only when the end of the slide 3 is directly abutted against the end of the first slideway 23 can the sliding bracket 2 be driven to slide, such that it is ensured that the mounting position of the slide 3 in the sliding bracket 2 is accurate and stable.

More specifically, the elastic member 4 is exemplarily a spring. Two sides of the elastic member 4 are respectively abutted against the supporting bracket 1 and the sliding bracket 2.

More specifically, a limiting slot configured to limit a tail end mounting position of the spring is arranged on both a bottom of the first open slot 11 and a back side the sliding bracket 2, so as to prevent offset and drop of the spring.

Figure 3:
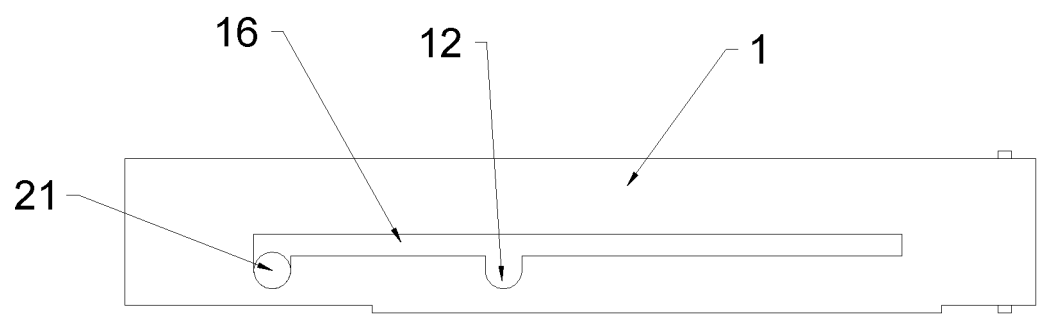
FIG. 3 is a side view of a securing bracket connected to a catch slot and a third slideway.

In some exemplary embodiments, as illustrated in FIG. 3, a third slideway 16 is arranged in a side wall of the first open slot 11, the catch slot 12 is in communication with the third slideway 16, and the snap-fitting portion 21 is arranged in the catch slot 12 or the third slideway 16.

Specifically, the snap-fitting portion 21 may be a stud, a roller, or the like, and in this embodiment, the snap-fitting portion 21 is exemplarily a stud.

More specifically, the catch slot 12 is exemplarily arranged on a lower side of the third slideway 16, such that when the snap-fitting portion 21 slides into the catch slot 12 due to its own weight and thus is engaged with the catch slot 12 when sliding in the third slideway 16 to the position of the catch slot 12, thereby securing the sliding bracket 2 on the securing bracket 1. In addition, in this embodiment, by holding up the slide support 2 or the slide 3, the snap-fitting portion 21 is disengageable from the catch slot 12 to release the engagement between the two, and at the same time, the sliding bracket 2 slides in a direction away from the bottom of the first open slot 11 under a return action of the elastic member 4, effectively simplifying the removal process of the slide 3.

More specifically, in this embodiment, the snap-fitting portion 21 may be slidably connected to the third slideway 16. That is, the sliding bracket 2 establishes a slidable engagement with the securing bracket 1 by sliding of the snap-fitting portion 21 in the third slideway 16, and achieves securing when the snap-fitting portion 21 slides to the catch slot 12.

More specifically, in the securing assembly according to the embodiments of the present disclosure, a plurality of catch slots 12 are arranged in the third slideway 16, which can achieve locking of the slide 3 at different positions. In this way, the number and positions of the catch slots 12 are designed according to actual needs.

In some exemplary embodiments, two catch slots 12 are arranged in each side wall of the first open slot 11, which are respectively connected to the end and the middle of the third slideway 16 close to the bottom of the first open slot 11.

Specifically, when the snap-fitting portion 21 is engaged with the catch slot 12 at the tail end, the slide 3 is disposed at an innermost side close to the bottom of the first open slot 11, and at this moment faces the microscopic imaging system 300 of the chip bonding apparatus, which facilitates bonding and alignment processing; and when the snap-fitting portion 21 is engaged with the catch slot 12 at the middle portion, the slide 3 is separated from an imaging region of the microscopic imaging system 300, and by avoiding relevant components of the microscopic imaging system 300, the microscopic imaging system 300 is prevented from affecting disassembly and replacement of the slider.

Figure 4:
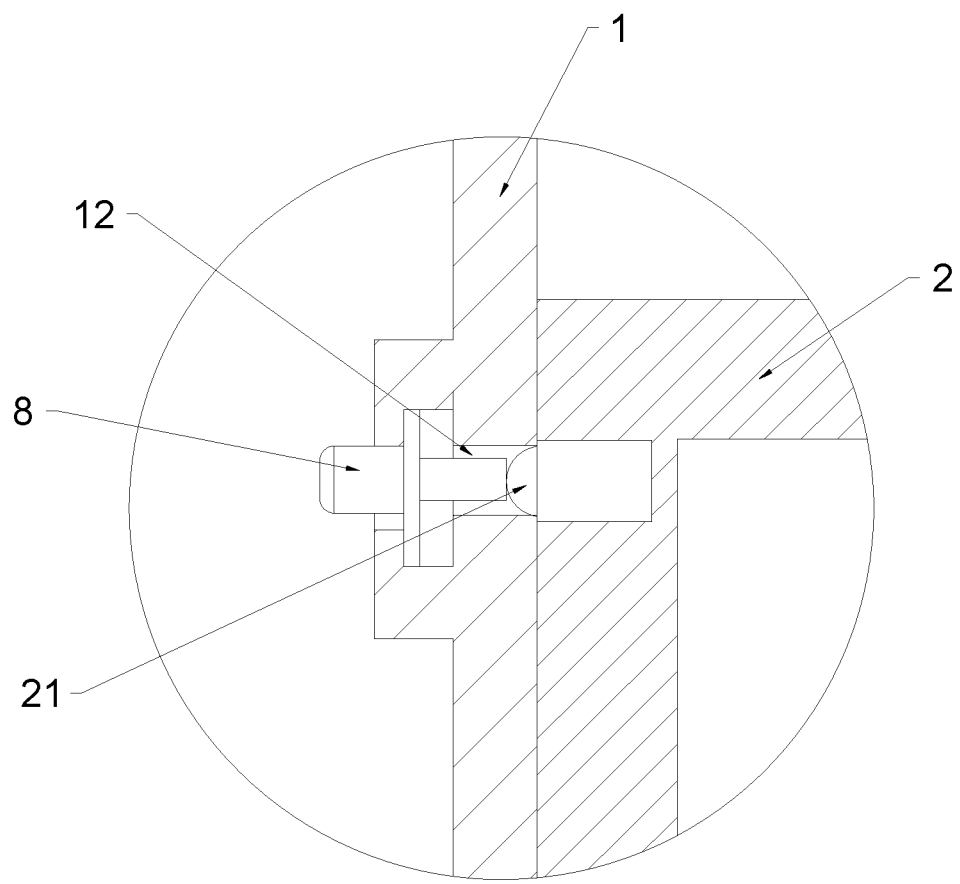
FIG. 4 is a top partial enlarged sectional view of a securing assembly engageable with a catch slot by a ball spring.
Figure 5:
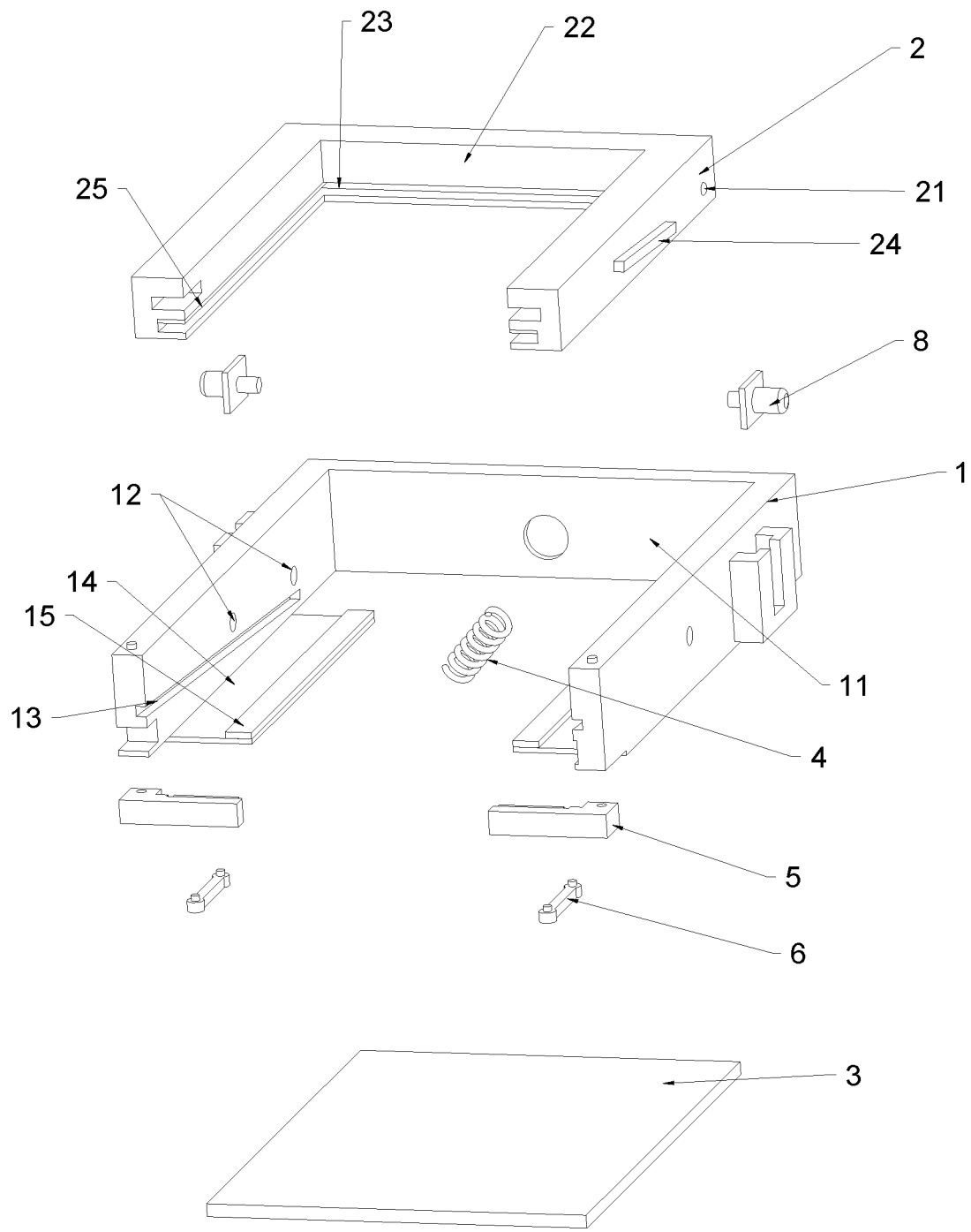
FIG. 5 is an exploded view of a securing assembly for a chip bonding apparatus according to some embodiments of the present disclosure.

In terms of structural relationship, the catch slot 12 is arranged to be connected to the third slideway 16, which may result in a descending displacement action when the sliding bracket 2 is secured, and may hence easily cause the to-be-bonded device 7 on the slide 3 to shift, loosen or even fall off. Therefore, as illustrated in FIG. 4, in some exemplary embodiments, the snap-fitting portion 21 is a ball spring secured onto the sliding bracket 2, and a ball end of the ball spring is engageable with the catch slot 12 to secure the sliding bracket 2.

Specifically, the ball spring is also referred to as a spring pin, and has a ball end having a self-telescopic return capability. During sliding of the sliding bracket 2, the ball end of the ball spring compresses and presses against the inner side wall of the first open slot 11. When the sliding bracket 2 slides to where securing is desired, the ball end of the ball spring is aligned with the catch slot 12 at the securing position, and the ball end thereof automatically returns, and extends and clamps in the catch slot 12, thereby achieving securing of the sliding bracket 2. The engagement between the catch slot 12 and the ball spring may be released by pressing the ball end of the ball spring in the catch slot 12 or applying a pushing force or a pulling force to the sliding bracket 2. In the embodiments, both the sliding and the securing of the sliding bracket 2 are both achieved under the same plane, thereby solving the problems of position deviation, loosening, falloff of the to-be-bonded device 7 on the slide 3.

It should be noted that when the slide 3 faces the microscopic imaging system 300, the return elastic force of the elastic member 4 is less than the force required for the ball end of the ball spring to come out of the catch slot 12, thereby ensuring that the sliding bracket 2 is stably secured at this position.

In some exemplary embodiments, the securing bracket 1 is provided with a release button 8 configured to press the ball end of the ball spring to detach from the catch slot 12.

Specifically, the release button 8 is exemplarily arranged on an outer side of the catch slot 12 close the bottom of the first open slot 11, and is configured to enable an operator to unlock the engagement state of the ball spring with the catch slot 12 by pressing the release button 8 at the end of bonding, and to move the slide 3 to a position where the slide 3 can be disassembled and replaced in the case where the sliding bracket 2 is displaced by the return elastic force of the elastic member 4.

More specifically, in the embodiments, two ball springs are exemplarily provided, and are symmetrically arranged on two sides of the sliding bracket 2; and two release buttons 8 are also provided, and are symmetrically arranged on two sides of the securing bracket 1. With configuration of the two release buttons 8, an operator is prevented from mistakenly touching the release buttons 8 and causing the slide 3 to move to eject.

More specifically, as illustrated in FIG. 4, a button slot is arranged on an outer side of the catch slot 12 at a position close to the bottom of the first open slot 11 on the securing bracket 1, and the release button 8 is slidably mounted in the button slot, wherein one end of the release button 8 may be protruded from an outer wall of the securing bracket 1, and the other end of the release button 8 is arranged to face towards the catch 12. In the embodiments when the ball spring is engaged with the catch slot 12 at this position, the release button 8 may be jacked up, such that one end of the release button 8 is protruded from the outer wall of the securing bracket 1, thereby facilitating an operator to press the release button 8. There is no need to additionally arrange an elastic member 4 on the release button 8, such as a spring, for return actions thereof, which effectively simplifies the structure of the securing assembly according to the embodiments of the present disclosure.

In some exemplary embodiments, a second slideway 13 is arranged in an inner side wall of the first open slot 11, and a sliding portion 24 slidably connected to the second slideway 13 is arranged on an outer side wall of the sliding bracket 2.

The second slideway 13 is obliquely arranged downwards along a direction away from an opening of the first open slot 11, and a supporting portion 14 extending towards the first open slot 11 is arranged on a bottom of the securing bracket 1, wherein a first gasket 15 configured to press the slide 3 tight is arranged on a top surface of the supporting portion 14.

Specifically, the sliding portion 24 may be a ball, a roller or a slide, which is slidably engaged with the second slideway 13 to enable the sliding bracket 2 to slide on the securing bracket 1 along a lengthwise direction of the second slideway 13.

More specifically, during the sliding of the sliding bracket 2 along the second slideway 13 towards the bottom of the first open slot 11, the height of the slide 3 gradually decreases, and when the sliding bracket 2 moves to the engagement position of the ball spring and the catch slot 12, the bottom of the slide 3 is abutted against the first gasket 15 on the supporting portion 14, and in this case, the first gasket 15 and the top surface of the first slideway 23 respectively press against the bottom surface and the top surface of the slide 3, such that clamping and securing of the slide 3 are achieved, and the position deviation of the slide 3 is further avoided.

More specifically, the first gasket 15 is exemplarily an elastic gasket, and the slide 3 is in contact with the first gasket 15 prior to moving to the engagement position of the ball spring and the catch slot 12, and when reaching the engagement position of the ball spring and the catch slot 12, the first gasket 15 deforms and clamps the slide 3 with the top surface of the first slideway 23 in response to the elastic reset force thereof. In the embodiments, the slide 3 may be clamped and secured by engagement between the first gasket 15 and the top surface of the first slideway 23, such that the slide 3 is prevented from being touched by mistake or moving too fast to be displaced relative to the sliding bracket 2. In this way, it is ensured that the slide 3 is mounted in a precise and secure position.

It should be noted that in the embodiments of the present disclosure, movement of the slide 3 is achieved by pushing the slide 3 to drive the sliding bracket 2 to move, and therefore, when the slide 3 is in contact with the first gasket 15, the slide 3 may not be subject to a friction force and may not be separated from the sliding bracket 2.

More specifically, in some other embodiments, the second slideway 13 may also be obliquely arranged upwards along a direction away from an opening of the first open slot 11, whereas the supporting portion 14 is arranged at the top of the securing bracket 1 and extends towards an inner side of the first open slot 11, and the first gasket 15 is arranged at the bottom surface of the supporting portion 14. In the embodiments, as the sliding bracket 2 slides along the second slideway 13 towards the bottom of the first open slot 11, the height of the slide 3 gradually increases, and the first gasket 15 and the bottom of the first slideway 23 cooperate to clamp and secure the slide 3.

In some exemplary embodiments, a second gasket 25 is arranged on the top surface of the first slideway 23.

Specifically, in these embodiments, the first gasket 15 and the second gasket 25 collaboratively clamp and secure the slide 3, such that the slide 3 is prevented from being crushed to fracture due to a thickness deviation, and an edge, a top surface and a bottom surface of the slide 3 is prevented from any damage during the clamping.

More specifically, the second gasket 25 is preferably an elastic gasket made of a material the same as that of the first gasket 15.

In some exemplary embodiments, a second gasket 25 is further arranged on the bottom surface of the first slideway 23, such that wear at the edge of the slide 3 may be reduced in the process of inserting the slide 3 into the first slideway 23.

In some exemplary embodiments, the chip bonding apparatus further includes: a corner brace 5, wherein the corner brace 5 is hinged-mounted at one end to a tail end (that is, one end at the opening of the slot) of the first open slot 11, and the corner brace 5 is connected to the sliding bracket 2 via a linkage 6.

Specifically, during the sliding of the sliding bracket 2, the connecting rod 6 can drive the corner brace 5 to swing; when the slide 3 is directly opposite to the microscopic imaging system 300 (namely, the snap-fitting portion 21 is engaged with the catch slot 12 close to the bottom of the first open slot 11), the other end of the corner brace 5 abuts against an outer side, away form the bottom of the first open slot 11, of the slide 3, thereby achieving clamping and securing of the slider 3 in the horizontal direction with the sliding bracket 2, and further avoiding position deviation of the slide 3.

More specifically, the embodiments also determine whether there is a foreign object in the first slideway 23 which hinders mounting of the slide 3. Where a foreign object is present in the first slideway 23, the slide 3 fails to be inserted into the bottom of the first slideway 23, such that the slide 3 is not properly mounted in terms of position. In this case, when the slide 3 has not moved to a position directly facing the microscopic imaging system 300, the outer side, away from the bottom of the first open slot 11, of the slide 3 is pressed by the other end of the corner brace 5, such that the slide 3 fail to push the sliding bracket 2 forward to slide to a position where the snap-fitting portion 21 is engaged with the catch slot 12 close to the bottom of the first open slot 11, and the sliding bracket 2 fails to be secured. It can thus be determined that there is a foreign object in the first slideway 23 that hinders the mounting of the slide 3, such that an operator timely knows the situation and clears the first slideway 23.

In some exemplary embodiments, the corner brace 5 is in an L shape, and a third gasket 51 is arranged on an inner side of an outer swinging end of the corner brace 5 (that is, an inner side of a bending portion away from a hinge mounting end thereof).

Specifically, two corner braces 5 are exemplarily arranged, and the two corner braces 5 are respectively hinged on two sides of the tail end of the first open slot 11 of the securing bracket 1 and are respectively connected to the sliding bracket 2 by the linkage 6.

More specifically, the third gasket 51 is configured to be engaged with a slot bottom of the sliding bracket 2 to secure and clamp the slide 3, such that the slide 3 is prevented from being crushed to fracture due to a thickness deviation, and an outer edge the slide 3 is prevented from any damage during the clamping.

In a second aspect, referring to FIG. 6, some embodiments of the present disclosure further provide a chip bonding apparatus. The chip bonding apparatus includes the securing assembly 100 for the chip bonding apparatus according to the first aspect.

Specifically, as illustrated in FIG. 6, the chip bonding apparatus further includes a base frame 200, a microscopic imaging system 300, a height adjustment mechanism 400, a workbench 500, a horizontal drive adjustment mechanism 600, and a lifting bracket 700. The workbench 500 is mounted on the base frame 200, and a horizontal position thereof is changed and adjusted by the horizontal drive adjustment mechanism 600. The workbench 500 is configured to bear a to-be-bonded substrate, and is internally provided with a heating structure configured to heat the to-be-bonded device and the to-be-bonded substrate which are in splicing contact so as to melt a bonding material to achieve bonding. The height adjustment mechanism 400 is mounted on the base frame 200 and is configured to adjust a height of the lifting bracket 700. The securing assembly 100 of the chip bonding apparatus and the microscopic imaging system 300 are both mounted on the lifting bracket 700 and are disposed above the workbench 500. The microscopic imaging system 300 includes a lens group, a camera, and a display (not illustrated) for acquiring images regarding a positional relationship between the to-be-bonded device 7 carried on the slide 3 and the to-be-bonded substrate.

More specifically, the horizontal drive adjustment mechanism 600 is exemplarily a motorized cross slide.

More specifically, where bonding is required, the chip bonding apparatus according to the embodiments of the present disclosure quickly mounts the slide 3 carrying the to-be-bonded device 7 by using the securing assembly 100 for the chip bonding apparatus. Afterwards, in the case where the slide 3 is adjusted to a suitable height by using the height adjustment mechanism 400, the microscopic imaging system 300 is capable of acquiring an image regarding the positional relationship between the to-be-bonded device 7 and the to-be-bonded substrate, and then adjusting the position of the to-be-bonded substrate by using the horizontal driving adjustment mechanism 600 until the height of the slide 3 is adjusted again by using the height adjustment mechanism 400 when the to-be-bonded device 7 is aligned with the position where the to-be-bonded substrate needs to be bonded. The to-be-bonded device 7 is brought into close contact with the to-be-bonded substrate at the position where the to-be-bonded substrate needs to be bonded, and then the bonding operation is completed by heating the to-be-bonded substrate using the worktable 500.

The chip bonding apparatus according to the embodiments of the present disclosure implements mounting and securing of the to-be-bonded device 7 by using the securing assembly, implements the mounting of the to-be-bonded device 7 by inserting the slide 3 into the first slideway 23, and achieves position locking when the sliding bracket 2 moves to a position where the snap-fitting portion 21 is engaged with the catch slot 12. In this way, the mounting position of the slide 3 is accurately adjusted, the bonding precision is effectively improved, the mounting and dismounting operations of the slide 3 are facilitated, and the bonding efficiency is effectively improved.

In the description of the present specification, reference terms such as "an embodiment," "some embodiments," "examples," "specific examples," "some examples," or the like are intended to refer to that the specific features, structures, materials, or characteristics which are described in combination with the embodiments or examples are included in at least one embodiment or example of the present disclosure. In this specification, schematic expressions of the above terms do not necessarily indicate the same embodiments or examples. In addition, the described specific features, structures, materials, or characteristics may be combined in any one or multiple embodiments or examples in a suitable way.

Described above are merely some exemplary embodiments of the present disclosure. Persons of ordinary skill in the art may derive various variations and modifications without departing from the inventive concept of the present disclosure. Such variations and modifications shall pertain to the protection scope of the present disclosure.

What is claimed is:

1. A securing assembly for a chip bonding apparatus, applicable to securing a to-be-bonded chip, wherein the securing assembly comprises: a securing bracket (1), a sliding bracket (2), and a slide (3); wherein
a first open slot (11) is arranged in the securing bracket (1), wherein the sliding bracket (2) is slidably mounted on the first open slot (11), a snap-fitting portion (21) is arranged on a side portion of the sliding bracket (2), and at least one catch slot (12) that is engageable with the snap-fitting portion (21) to secure the sliding bracket (2) is arranged in the securing bracket (1);
a second open slot (22) is arranged in the sliding bracket (2), wherein a slideway (23) is arranged in each of two side walls of the second open slot (22), and the slide (3) is inserted into the slideway (23) and hence mounted in the second open slot (22);
the snap-fitting portion (21) is a ball spring secured on the sliding bracket (2), wherein a ball end of the ball spring is engageable with the catch slot (12) to secure the sliding bracket (2);
a second slideway (13) is arranged in an inner side wall of the first open slot (11), and a sliding portion (24) slidably connected to the second slideway (13) is arranged on an outer side wall of the sliding bracket (2); and
the second slideway (13) is obliquely arranged downwards along a direction away from an opening of the first open slot (11), and a supporting portion (14) extending towards the first open slot (11) is arranged on a bottom of the securing bracket (1), wherein a first gasket (15) configured to press the slide (3) tight is arranged on a top surface of the supporting portion (14).

2. The securing assembly according to claim 1, wherein the securing assembly further comprises an elastic member (4), wherein the elastic member (4) is arranged between the securing bracket (1) and the sliding bracket (2), and disposed on a back side of the second open slot (22).

3. The securing assembly according to claim 1, wherein the securing bracket (1) is provided with a release button (8) configured to press the ball end of the ball spring to detach from the catch slot (12).

4. The securing assembly according to claim 1, wherein a second gasket (25) is arranged on a top surface of the first slideway (23).

5. The securing assembly according to claim 1, further comprising: a corner brace (5), wherein the corner brace (5) is hinged-mounted at one end to a tail end of the first open slot (11), and the corner brace (5) is connected to the sliding bracket (2) via a linkage (6).

6. The securing assembly according to claim 5, wherein the corner brace (5) is in an L shape, and a third gasket (51) is arranged on an outer swinging end of the corner brace (5).

7. A chip bonding apparatus, comprising a securing assembly (100) for the chip bonding apparatus, wherein the securing assembly (100) is configured to secure a to-be-bonded chip, and comprises: a securing bracket (1), a sliding bracket (2), and a slide (3); wherein
a first open slot (11) is arranged in the securing bracket (1), wherein the sliding bracket (2) is slidably mounted on the first open slot (11), a snap-fitting portion (21) is arranged on a side portion of the sliding bracket (2), and at least one catch slot (12) that is engageable with the snap-fitting portion (21) to secure the sliding bracket (2) is arranged in the securing bracket (1);
a second open slot (22) is arranged in the sliding bracket (2), wherein a slideway (23) is arranged in each of two side walls of the second open slot (22), and the slide (3) is inserted into the slideway (23) and hence mounted in the second open slot (22);

the snap-fitting portion (21) is a ball spring secured on the sliding bracket (2), wherein a ball end of the ball spring is engageable with the catch slot (12) to secure the sliding bracket (2);

a second slideway (13) is arranged in an inner side wall of the first open slot (11), and a sliding portion (24) slidably connected to the second slideway (13) is arranged on an outer side wall of the sliding bracket (2); and the second slideway (13) is obliquely arranged downwards along a direction away from an opening of the first open slot (11), and a supporting portion (14) extending towards the first open slot (11) is arranged on a bottom of the securing bracket (1), wherein a first gasket (15) configured to press the slide (3) tight is arranged on a top surface of the supporting portion (14).

8. The chip bonding apparatus according to claim 7, wherein the securing assembly further comprises an elastic member (4), wherein the elastic member (4) is arranged between the securing bracket (1) and the sliding bracket (2), and disposed on a back side of the second open slot (22).

9. The chip bonding apparatus according to claim 7, wherein the securing bracket (1) is provided with a release button (8) configured to press the ball end of the ball spring to detach from the catch slot (12).

10. The chip bonding apparatus according to claim 7, wherein a second gasket (25) is arranged on a top surface of the first slideway (23).

11. The chip bonding apparatus according to claim 7, further comprising: a corner brace (5), wherein the corner brace (5) is hinged-mounted at one end to a tail end of the first open slot (11), and the corner brace (5) is connected to the sliding bracket (2) via a linkage (6).

12. The chip bonding apparatus according to claim 11, wherein the corner brace (5) is in an L shape, and a third gasket (51) is arranged on an outer swinging end of the corner brace (5).

* * * * *